United States Patent
Klebanoff

(10) Patent No.: US 6,279,601 B1
(45) Date of Patent: Aug. 28, 2001

(54) LIQUID ZONE SEAL

(75) Inventor: Leonard E. Klebanoff, Dublin, CA (US)

(73) Assignee: EUV LLC, Santa Clara, CA (US)

( * ) Notice: Subject to any disclaimer, the term of this patent is extended or adjusted under 35 U.S.C. 154(b) by 0 days.

(21) Appl. No.: 09/563,168

(22) Filed: May 2, 2000

(51) Int. Cl.$^7$ .................................................. F16K 13/10
(52) U.S. Cl. .............................. 137/247.49; 137/247.41; 137/247.19; 355/18; 355/30
(58) Field of Search .................. 137/247.41, 247.49, 137/247.19; 355/67, 68, 30, 18

(56) References Cited

U.S. PATENT DOCUMENTS

| | | | |
|---|---|---|---|
| 1,708,465 | * 4/1929 | Boosey | 137/247.19 |
| 3,290,022 | * 12/1966 | Brown, Jr. et al. | 137/247.49 X |
| 4,198,717 | * 4/1980 | Kessel | 137/247.41 X |
| 4,502,500 | * 3/1985 | Upton | 137/247.41 X |
| 6,031,598 | * 2/2000 | Tichenor et al. | 355/67 |

\* cited by examiner

*Primary Examiner*—John Rivell
(74) *Attorney, Agent, or Firm*—Donald A. Nissen

(57) ABSTRACT

A seal assembly that provides a means for establishing multiple pressure zones within a system. The seal assembly combines a plate extending from the inner wall of a housing or inner enclosure that intersects with and is immersed in the fluid contained in a well formed in a tray contained within the enclosure. The fluid is a low vapor pressure oil, chemically inert and oxidation resistant. The use of a fluid as the sealing component provides a seal that is self-healing and mechanically robust not subject to normal mechanical wear, breakage, and formation of cracks or pinholes and decouples external mechanical vibrations from internal structural members.

17 Claims, 3 Drawing Sheets

LIQUID ZONE SEAL

STATEMENT OF GOVERNMENT INTEREST

This invention was made with Government support under contract no. DE-AC04-94AL85000 awarded by the U. S. Department of Energy to Sandia Corporation. The Government has certain rights in the invention.

CROSS-REFERENCE TO RELATED APPLICATIONS

Not applicable.

BACKGROUND OF THE INVENTION

The present invention is directed generally to a liquid seal for maintaining pressure differentials between various parts of an apparatus. In particular, to a seal that provides for defining separately controlled vacuum zones. The low gas conductance seal is mechanically robust and is designed so that mechanical vibrations cannot be transmitted through the seal.

Quite often, within an apparatus, such as a piece of processing equipment, it can be desirable to define zones having different pressures and to maintain these differential pressures for extended periods of time. There are various ways of accomplishing this separation such as by the use of physical structures or barriers that act to seal one region of the apparatus from another. In systems that operate at sub-atmospheric pressures, these zones can be maintained by means of differential pumping, i.e., having separate vacuum pumps to control the pressure-within the various regions. In addition to establishing zones or regions having different pressures, it can also be necessary in some applications to minimize or substantially eliminate vibration transmission from one zone or region to another.

Seals capable of creating zones of different pressure within a vacuum system while at the same time transmitting negligible or substantially no vibration are particularly desirable for applications such as Extreme Ultraviolet Lithography (EUVL). Here Extreme Ultraviolet (EUV) radiation (10–14 nm) is used to produce features having linewidths less than 100 nm. Because of the very fine dimensional tolerances (≈10s of nm) involved in EUVL low vibrational transmission is an absolute necessity. It can also be desirable to have a seal that can operate with pressure differentials up to 0.5 Torr while at the same time having negligible gas conductance. Moreover, it can also be desirable to have a mechanically robust seal that can maintain its structural integrity. It can be necessary to clean the inner surfaces of the vacuum system from such things as carbon deposits. This cleaning operation is frequently done by rf-discharge cleaning, wherein reactive oxygen species are introduced into the vacuum system. Thus, it is further desirable that the zone seal be resistant to reactive ion species used for cleaning the vacuum system.

SUMMARY OF THE INVENTION

This invention is based, in part, on the recognition that in some technologies it is necessary to create zones having different pressures within the same apparatus. This is particularly true in vacuum-based technologies such as extreme ultraviolet lithography (EUVL), electron projection lithography (EPL), and ion beam lithography (IPL), were it is necessary to create and maintain separate vacuum zones while at the same time maintaining low vibration transmissibility from one structure to another.

Accordingly, it is an object of this invention to provide a seal assembly for maintaining different pressure zones in an apparatus.

It is another object to provide a seal assembly for a vacuum system having separately controlled vacuum zones.

It is a further object to provide a seal assembly that will not transmit mechanical vibrations from one zone to another or from the walls of the apparatus to the interior.

Yet another object is to provide a seal assembly that is mechanically robust.

A further object is to provide a seal assembly that can maintain a pressure differential of at least about 0.5 Torr between the separate zones.

Another object is to provide a seal assembly that will not be a source of gaseous contaminants.

Other objects and advantages of the present invention will become apparent from the following description and accompanying drawings.

In one aspect, the invention is directed to a conductance limiting and substantially vibration-free zone seal assembly for establishing zones of differential pressure in an apparatus by connecting first and second members that are spaced apart, the seal assembly including:

a housing defining a vacuum chamber;

a tray, or barrier, within the vacuum chamber that can be supported by at least one support member, wherein the tray separates the vacuum chamber into a first compartment and a second compartment which are at different pressures;

a well or depression formed along the perimeter of the tray that contains fluid having a low vapor pressure; and means for joining the inner surface of the housing to the fluid, wherein the combination of the joining means and the well along the perimeter of the tray form an aperture at the boundary between pressure zones and the fluid in the well seals the aperture forming a gas conductance limiting and vibration-free seal.

In another aspect, the present invention is directed to a EUV photolithography apparatus that includes:

a housing having an outer enclosure that defines a cavity and an inner enclosure, disposed within the cavity, that defines a vacuum chamber;

a first tray, situated within the vacuum chamber, that can be supported by at least one support member, wherein the first tray separates the vacuum chamber into a first and a second zone, wherein the first and second zones can be at different pressures;

a second tray, situated within the vacuum chamber, that can be supported by at least one second support member, and spaced apart from the first tray, wherein the second tray defines a third chamber that can be at a different pressure from either of the first and second chambers;

a reticle stage that supports a reflective reticle, disposed within the first chamber;

a projection optics device disposed within the second chamber;

a wafer stage that supports a photoresist coated wafer disposed within the third chamber;

a well or depression formed along the perimeter of each tray that contains fluid having a low vapor pressure; and means for joining the inner surface of the inner enclosure to the fluid, wherein the combination of the joining means and the fluid contained in the well formed along the perimeter of each tray provides a conductance limiting and vibration-free seal that serves to define and maintain a pressure zone within the apparatus.

In a preferred embodiment, joining means comprises a plate extending from the inner wall of housing or inner enclosure that intersects with and is immersed in the fluid contained in the well formed in the tray contained within the vacuum enclosure. In this instance, the fluid is a low vapor pressure oil, chemically inert and oxidation resistant.

BRIEF DESCRIPTION OF THE DRAWINGS

The accompanying drawings, which are incorporated into and form a part of the disclosure of the invention, illustrate embodiments of the apparatus of the invention and together with the written description serve to explain the principles of the invention. In the drawings like elements are referred to by like numbers.

DETAILED DESCRIPTION OF THE INVENTION

The present invention is directed to a seal assembly for defining zones of differing pressure in an apparatus. The novel seal assembly uses a low vapor pressure fluid as the sealing material to provide a low gas conductance seal having the added advantage of very low vibrational transmissibility. The structure and operation of the invention is illustrated and exemplified by application to an extreme ultraviolet lithographic (EUVL) stepper apparatus.

Extreme ultraviolet lithography is a method for producing integrated circuit (IC) components that uses radiation in the region of 10–14 nm. However, because this radiation is strongly absorbed by all materials the lithography process must be performed at pressures <1 mTorr. Moreover, because features having linewidths of less than 100 nm generally and as small as 30 nm are imaged by this lithographic method, is it critical that vibrations be reduced to a minimum.

The EUVL stepper apparatus itself encompasses a source chamber and a main projection chamber, both evacuated. EUV radiation, produced in the source chamber, is transported into the main projection chamber where it is used to image IC components. A complete description of the structure and operation of an EUVL stepper is contained in U.S. Pat. No. 6,031,598 and entitled "An Extreme Ultraviolet Lithography Machine", incorporated herein in its entirety.

Figure 1:
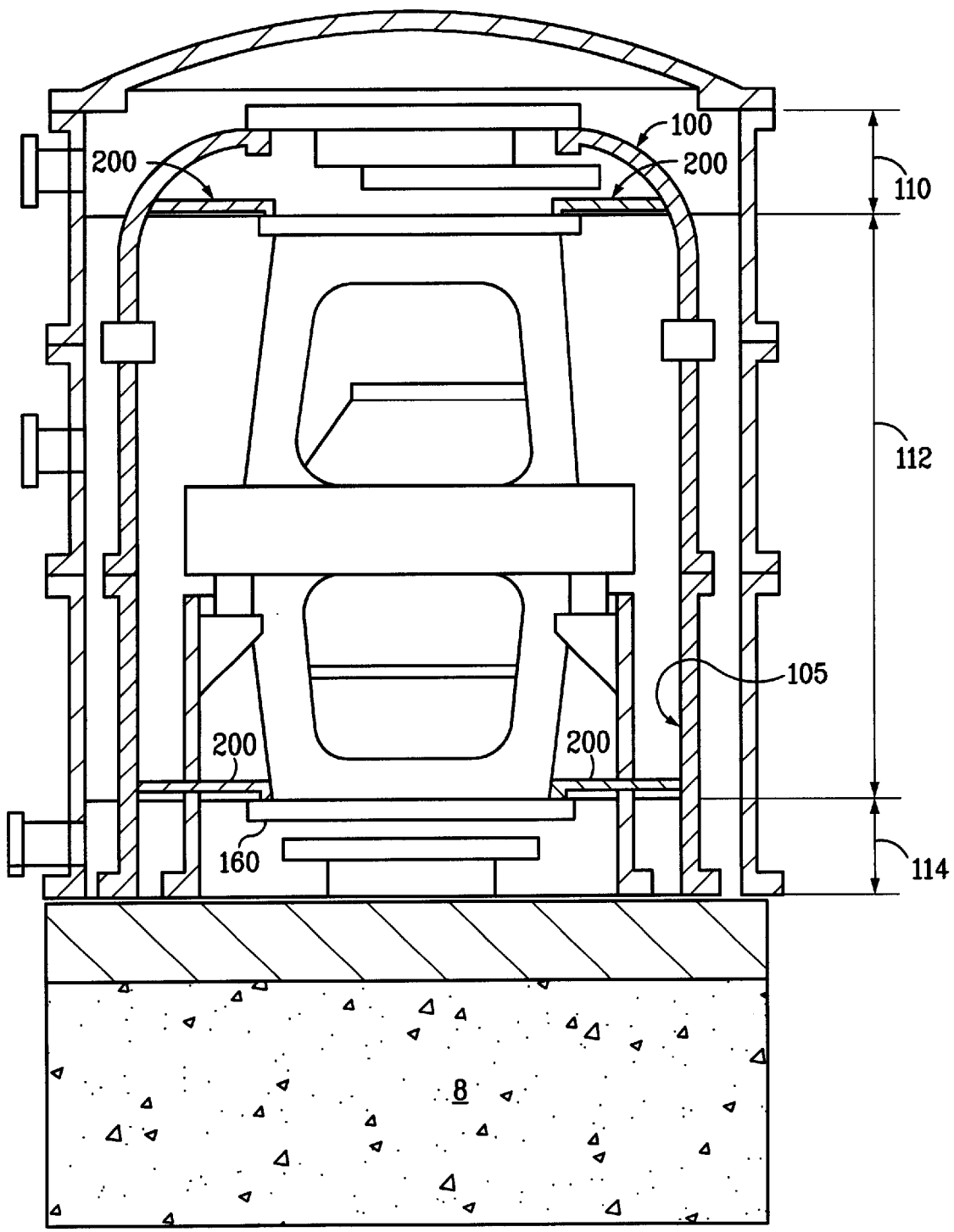
FIG. 1 is a schematic showing the zones of an EUVL stepper.

The main projection chamber 100, which is shown schematically in FIG. 1, is divided into three zones, a reticle zone 110, a projection optics zone 112, and a wafer zone 114. The reticle and wafer zones have their own separate vacuum systems and seal assemblies 200 are used to maintain pressure differentials particularly between these zones. It is particularly desirable to keep wafer zone 114 separate from projection optics zone 112 by a physical barrier. The interposition of an impermeable seal between these two zones is necessary because hydrocarbon vapors given off by a photoresist-covered wafer could otherwise migrate into projection optics zone 112 where they would degrade the performance of the optics used in the projection optics.

Wafer metrology tray 160, which is positioned at a lower part of the interior region of projection chamber 100 and separates wafer zone 114 from optics zone 112, has a circular perimeter that generally matches the contour of projection chamber 100. A seal assembly 200 at the interface of the perimeter of wafer metrology tray 160 and the inner surface 105 of projection chamber 100 provides a conductance, limiting seal as further described herein. A similar seal assembly separates reticle zone 110 from optics zone 112.

Figure 2:
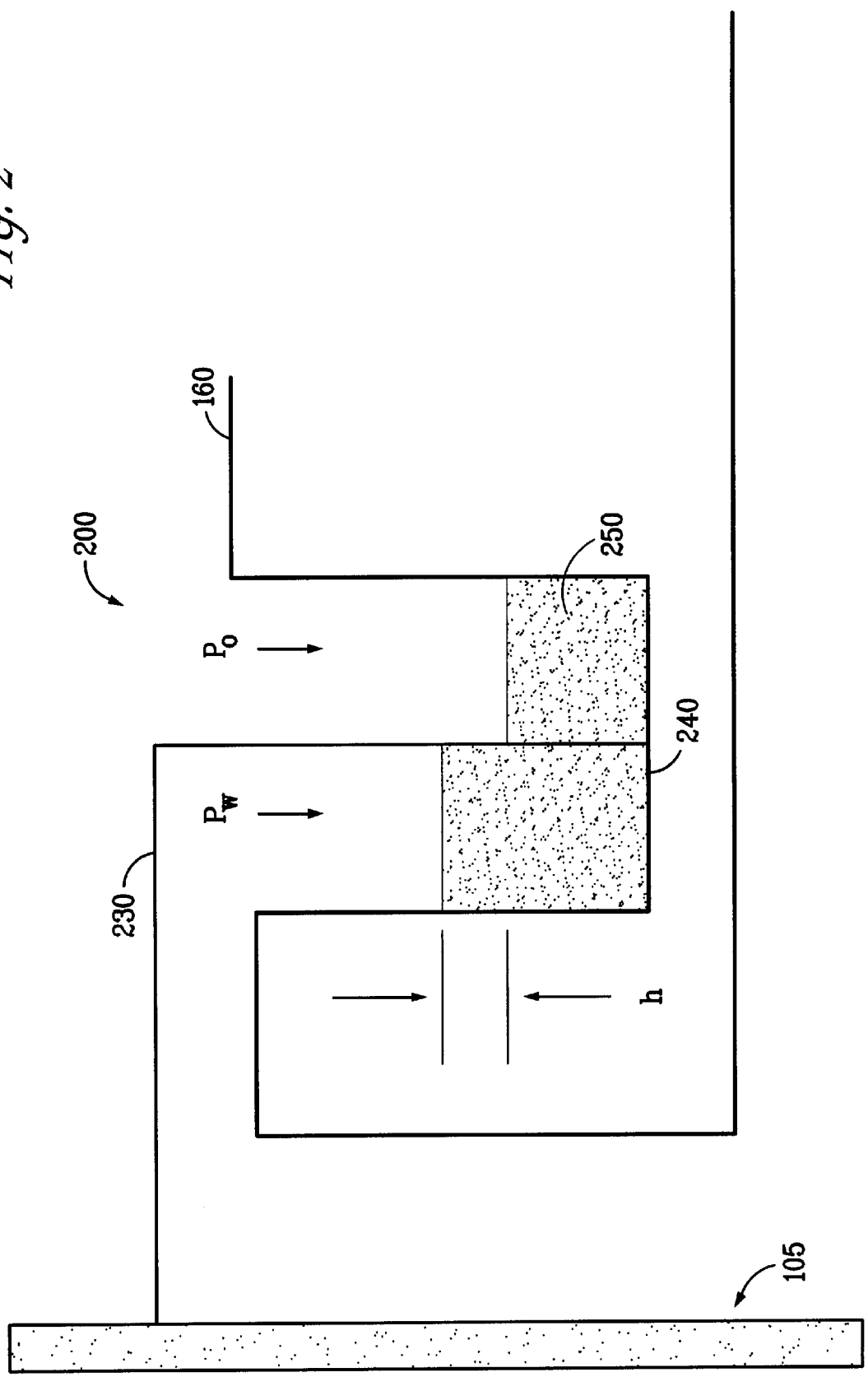
FIG. 2 shows the general features of the seal assembly.

FIG. 2 illustrates the general features of one embodiment of a zone seal assembly, a cylindrically symmetrical low (substantially zero) conductance zone seal assembly that can be used not only to maintain pressure differentials between zones in an apparatus but also provide a physical barrier to material migration between zones. In the embodiment illustrated in FIG. 2, seal assembly 200 comprises a cantilever 230 that projects from the interior surface 105 of the vertical wall of an enclosing structural member to an inner structural member 160. As is apparent, the vertical wall and the inner structural member represent any adjacent pair of structures where a conductance limiting seal is desired. Inner structural member 160 has a well or trench 240 formed on the upper surface proximate the edge and around the perimeter of the inner structural member. The cantilever and well together define an aperture and the boundary between pressure zones. A low vapor pressure fluid 250 is placed in well 240 to seal the aperture. It is preferred that the depth of low vapor pressure fluid 250 be about 1 cm and that the fluid not only have a pressure of $\leq 10^{-10}$ Torr but also be chemically inert, including oxidation resistant. The choice of a low vapor pressure fluid for any given seal design will depend on the particular sealing requirements desired such as allowable vapor pressure, outgassing, mechanical properties, etc. For EUVL applications, Brayco 815Z oil is particularly preferred. Cantilever 230 is shaped such that the distal end (that end of cantilever 230 furthest from inner wall 105) of cantilever 230 projects downwardly and into the low vapor pressure fluid contained in well 240. Cantilever 230 can be made of any material that is compatible with the operation of the apparatus (e.g., resistant to attack by vapors or gases that can bi- present in the apparatus, will not outgas contaminants, and is physically robust). It is preferred that the cantilever be made of a metal.

The combination of cantilever 230 and low vapor pressure fluid 250 contained in well 240 and in which the distal end of cantilever 230 is immersed forms a seal assembly 200, having substantially zero gas conductance, that prohibits transport of material form one zone to another. Moreover, seal assembly 200 provides for both positive and negative pressure differentials across the seal. Pressure differences are accommodated by adjustment in the height (h) of the column of fluid 251) on either side of the cantilever 230. As is apparent, if the pressure on the Pw side of cantilever 230 is less than that of the Po side (Pw<Po), the fluid will rise on the Pw side of cantilever 230 to a value of h given by the pressure difference across the seal and the density of fluid 250. For Pw>Po fluid will rise on the Po side of the cantilever. Well 240 must be deep enough not only to cover the distal end of cantilever to form a fluid seal but also to accommodate reasonable pressure differences across seal assembly 200. In the case where Brayco 815Z oil is the fluid contained in well 240, for a difference in pressure of 0.5 Torr across the seal, the difference in heights of the oil on either side of the cantilever will be about 3 mm.

As discussed above, it is desirable that the seal assembly maintaining different pressure zones within an apparatus not transmit mechanical vibration from the walls of an apparatus to internal structural members. In the present invention, the zone seal formed between cantilever 230 and low vapor pressure fluid 250 provides mechanical decoupling since external vibrations can only be transmitted to internal members through fluid 250. Vibrational forces can only be transmitted by two force transfer mechanisms; 1) movement of cantilever 230 in a direction normal to the walls of well 240 to generate a normal pressure wave and 2) movement of cantilever 230 in a direction parallel to the walls of well 240 to generate shear stress. Analytical and numerical computations of the transmission of vibrational forces through seal assembly 200 has shown them to be substantially zero; external vibrations are mechanically decoupled from internal structures.

Figure 3A:
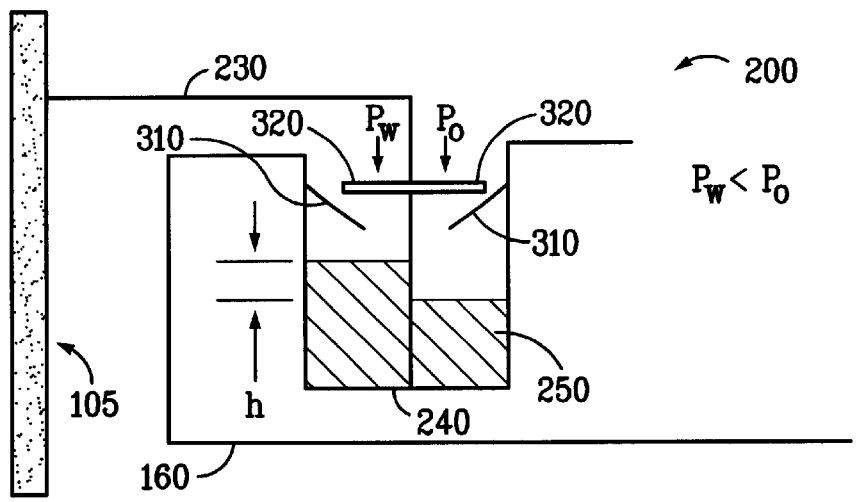
FIG. 3 shows a self-sealing embodiment to prevent fluid blow-out.
Figure 3B:
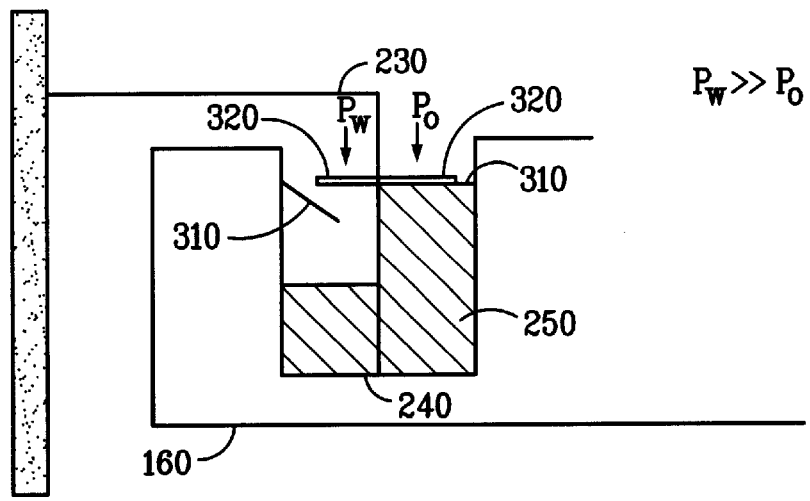
Figure 3C:
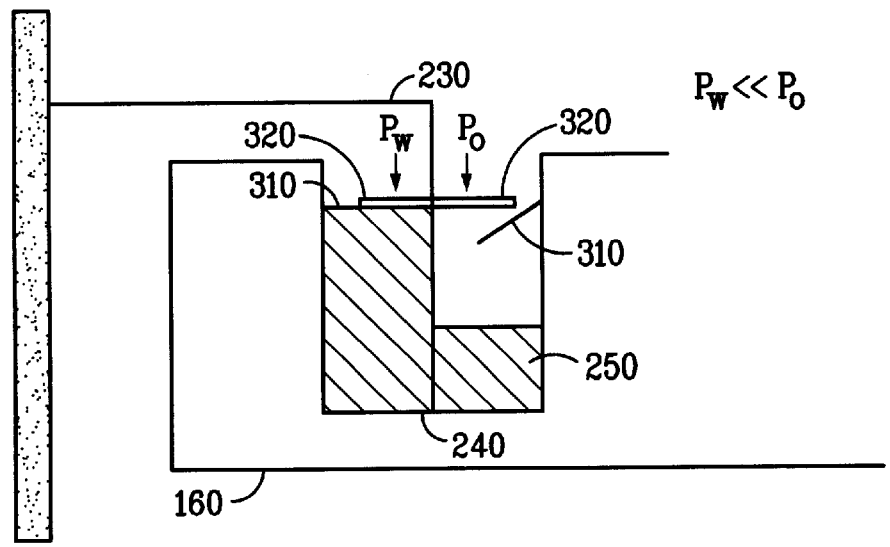

It may be that, by accident or otherwise, Pw becomes much larger then Po (Pw >>Po), or conversely (Pw <<Po). In either case, when the pressure difference becomes large enough fluid 250 cannot be contained within the confines of well 240 and is forced or "blown-out" out of the well. For obvious reasons, it is desirable to prevent this discharge of fluid from the well. One means for preventing accidental oil "blow-out" is illustrated in FIGS. 3A–3C. Other means for preventing fluid "blow-out" would be obvious to those skilled in the art and have been contemplated by the inventor, A sealing member 310 is flexibly joined to opposing inner surfaces of well 240 (FIG. 3A). It is preferable that sealing member 310 project away from the inner surface of well 240 at a slight angle (as illustrated in FIG. 3A). As the fluid level rises on either side of the cantilever the fluid on that side will eventually force the corresponding sealing member 310 against sealing surface 320 (as illustrated in FIGS. 3B and 3C). The sealing surface, fixedly mounted on cantilever 230 and projecting outwardly therefrom, engages the sealing member and thereby seals that side of seal assembly, thereby preventing fluid from being "blown-out" of the well. When the pressure difference decreases and the fluid re-establishes its proper height, sealing members 310 return to their normal positions (FIG. 3A).

The zone seal assembly is mechanically robust in that the seal cannot fail in the mechanical sense since the fluid component that provides the seal is self-healing. Further, the zone seal assembly is not subject to normal mechanical wear, breakage, and formation of cracks or pinholes.

In summary, the present invention provides a seal assembly that uses a fluid to maintain zones of different pressure within an apparatus. The seal offers the advantages that it has substantially zero gas conductance, is physically robust, non-contaminating, and is an efficient de-coupler of mechanical vibrations.

It will be understood that the described arrangements of apparatus and the methods pertaining thereto are merely illustrative of applications of the principles of this invention and many other embodiments and modifications can be made by those of skill in the art without departing from the spirit and scope of the invention as defined in the claims.

I claim:

1. A seal assembly for connecting an inner and an outer spaced apart members, the seal assembly comprising:
   a cantilever attached to the outer member and extending to the inner member, wherein the inner member has an upper and a lower surface;
   a well in the upper surface and around the perimeter of the inner member, wherein the cantilever and well define an aperture; and
   a fluid in the well, said fluid sealing the aperture to provide a seal having substantially zero gas conductance and accommodate either positive or negative pressure differentials across the seal assembly, thereby providing a substantially vibration-free connection between the inner and outer spaced apart members.

2. The seal assembly of claim 1, wherein the fluid comprises a fluid that is chemically inert and oxidation resistant.

3. The seal assembly of claim 1, wherein the fluid is a fluid having a low vapor pressure.

4. The seal assembly of claim 3, wherein the fluid has a vapor pressure less than about $10^{-10}$ Torr.

5. The seal assembly of claim 1, further including a seal member flexibly joined to the inner surface of the well and a sealing surface joined to the cantilever.

6. The seal assembly of claim 1, wherein the seal assembly defines zones at different pressures.

7. The seal assembly of claim 6, wherein the zones are maintained at a pressure differential of at least about 0.5 Torr.

8. An apparatus, comprising;
   a housing defining a chamber having an inner surface;
   a tray within the chamber supported by at least one support member, wherein the tray separates the chamber into a first compartment and a second compartment which are at different pressures, and wherein said tray is spaced apart from the inner surface of the chamber;
   a well formed proximate the edges and along the perimeter of the tray, wherein said well contains a fluid; and
   a cantilever attached to and joining the inner surface of the chamber to the fluid, wherein the combination of the cantilever and the fluid contained in the well form a seal assembly that vibrationally isolates said tray from said housing.

9. The apparatus of claim 8, wherein the chamber is a pressure chamber.

10. The apparatus of claim 8, wherein the chamber is a vacuum chamber.

11. The apparatus of claim 8, wherein the fluid comprises a fluid that is chemically inert, oxidation resistant, and has a low vapor pressure.

12. The apparatus of claim 11, wherein the fluid has a vapor pressure less than about $10^{-10}$ Torr.

13. The apparatus of claim 8, further including a seal member flexibly joined to the inner surface of the well and a sealing surface joined to the cantilever.

14. A photolithography system, comprising:
   a housing having an outer enclosure that defines a cavity and an inner chamber that defines a vacuum chamber, wherein the inner chamber is disposed within the cavity;
   a first tray, situated within the vacuum chamber, that is supported by a least one first support member, wherein said first tray separates the vacuum chamber into a first zone and a second zone that are at different pressures;
   a second tray, spaced apart from said first tray, and situated within the vacuum chamber, wherein said second tray defines a third zone that is at a different pressure from that of the first and second zones; and
   seal assemblies connecting said first and second trays to the inner surface of the inner enclosure, wherein said seal assemblies provide a substantially vibration-free and low gas conductance connection between the inner surface of the inner enclosure and said first and second trays, each seal assembly comprising
      a cantilever attached to the inner surface of the inner enclosure and extending to a tray, wherein the tray has an upper and a lower surface;

a well in the upper surface and around the perimeter of the tray, wherein said cantilever and well define an aperture; and a fluid in the well, said fluid sealing the aperture.

15. The photolithography system of claim 14, wherein the fluid comprises a fluid that is chemically inert, oxidation resistant, and has a low vapor pressure.

16. The photolithography system of claim 15, wherein the fluid has a vapor pressure less than about $10^{-10}$ Torr.

17. The photolithography system of claim 14, further including a seal member flexibly joined to the inner surface of the well and a sealing surface joined to the cantilever.

* * * * *